United States Patent [19]

Matloubian

[11] Patent Number: 4,753,896
[45] Date of Patent: Jun. 28, 1988

[54] SIDEWALL CHANNEL STOP PROCESS

[75] Inventor: Mishel Matloubian, Dallas, Tex.

[73] Assignee: Texas Instruments Incorporated, Dallas, Tex.

[21] Appl. No.: 933,500

[22] Filed: Nov. 21, 1986

[51] Int. Cl.[4] .................. H01L 21/225; H01L 21/308
[52] U.S. Cl. ...................................... 437/029; 357/91;
437/21; 437/34; 437/39; 437/45; 437/175;
437/200; 437/912
[58] Field of Search .................... 437/21, 29, 34, 39,
437/45, 175, 200, 912; 357/91

[56] References Cited

U.S. PATENT DOCUMENTS

| | | | |
|---|---|---|---|
| 4,393,578 | 7/1983 | Cady et al. | 29/576 W |
| 4,408,386 | 10/1983 | Takayashi et al. | 29/576 E |
| 4,534,824 | 8/1985 | Chen | 29/576 W |
| 4,561,932 | 12/1985 | Gris et al. | 29/576 W |
| 4,641,417 | 2/1987 | McDavid | 29/571 |
| 4,653,173 | 3/1987 | Chen | 29/571 |

Primary Examiner—Upendra Roy

Attorney, Agent, or Firm—Stanton C. Braden; James T. Comfort; Melvin Sharp

[57] ABSTRACT

A new way of making sidewall channel stops for silicon on insulator devices (including silicon on oxide, silicon on nitride, and silicon on sapphire devices). While the moat regions 11, 13 (where the active devices will be formed) are covered by thick masking material 24, a high energy implantation step introduces additional doping into exposed silicon regions 14'. Before the mesa etch is performed to isolate the individual active device regions 32 a filament 28 is formed on the walls of the masking material 24 which covers the predetermined locations of the active device regions 32. The mesa etch is then performed using a chemistry which will be blocked not only by the original masking material 24 but also by the sidewall filaments 28. Thus, the doping level defined by implantation into regions 14' will extend into the sidewalls of the mesas 32 for a distance which is controlled not only by the lateral diffusion length of those dopants, but also by the thickness of the sidewall filament 28.

49 Claims, 3 Drawing Sheets

SIDEWALL CHANNEL STOP PROCESS

STATEMENT OF GOVERNMENT INTEREST

The following statement is believed to be true with respect to at least some of the various inventions described in the present application:

This invention was made with Government support under Contract No. DNA001-86-C0090 awarded by the Defense Nuclear Agency, and under Contract No. 8162/501 awarded by the Air Force Weapons Laboratory through the Computer Sciences Corporation. Accordingly, the Government has certain rights in this invention.

BACKGROUND AND SUMMARY OF THE INVENTION

The present invention relates to silicon on insulator integrated circuits.

A common problem in silicon on insulator devices is passivation of the sidewalls. Since the sidewalls are not (100) silicon, they will often have an inherently somewhat lower threshold voltage than the plane in which the primary active devices are constructed, and thus passivation of the sidewalls is particularly difficult.

Moreover, silicon on insulator circuits are particularly attractive for applications which must be extremely resistant to single event upset. For such applications, the fixed charge density of the dielectric interface cannot be reliably expected to stay at the as-manufactured level, and therefore it is particularly desirable that the parasitic transistors along the sidewalls of the mesa be very far from inversion, i.e. very far away from their threshold voltages.

Heavier channel stop doping on the sidewalls of the mesas would obviously help to accomplish this, but to date there has been no fully satisfactory way to achieve this. Since these sidewall regions are nearly vertical, they are difficult to hit with implantation steps. Moreover, there has heretofore been no convenient self-aligned sequence of steps to leave the sidewall regions exposed.

The most popular way to form the sidewall channel stops has been to introduce a heavy doping, patterned by the mesa mask, and drive that dopant to achieve a substantial lateral diffusion before the mesa etch is performed. However, this has the disadvantage of requiring long furnace times early in the process, and also results in a device where the threshold voltage of the parasitic sidewall transistors in the finished device is subcritically dependent on the time and temperature of this furnace step. Moreover, due to the concentration gradient implied by the diffusion equations, such lateral diffusion techniques will always produce a net concentration in the sidewalls of the mesa which is lower than the original maximum net concentration in the silicon between mesas.

That is, devices formed using the present invention will tend to not only have a region wherein the dopant concentration of the sidewall channel stop tails off in a manner indicated by the diffusion equations (as will the devices made by previously known methods), but will also have a surface region where the concentration of impurities is reasonably constant.

Thus, the present invention provides major advantages in device characteristics at the cost of only minor additions to processing complexity. That is, the present invention provides silicon on insulator IGFET integrated circuit devices which, for a given effective channel length and dielectric composition, are substantially more resistant to turn on of the parasitic sidewall device than devices made by previously known methods.

The present invention also provides silicon on insulator IGFET integrated circuit devices which can remain functional even when the fixed charge density of the dielectric interface increases greatly from the as-manufactured level.

The present invention also provides silicon on insulator IGFET integrated circuit devices which can remain functional after withstanding a substantially higher total dose of ionizing radiation than silicon on insulator IGFET integrated circuit devices of the prior art.

further advantage of the present invention is that leakage current can be significantly reduced. That is, since the threshold voltage of the parasitic transistor is substantially increased, this parasitic device in its normal state will be farther away from its threshold voltage, and therefore its subthreshold current will be less.

Thus, the present invention provides integrated circuits with substantially improved radiation hardness.

The present invention also advantageously provides integrated circuits with improved radiation hardness at no sacrifice in density.

The present invention also advantageously provides integrated circuits with improved radiation hardness and reduced power consumption.

The advantage of reduced leakage currents is particularly important in CMOS integrated circuits. Thus, the present invention is especially advantageous for CMOS silicon on insulator and CMOS silicon on sapphire integrated circuits.

Thus, the present invention provides silicon on insulator IGFET integrated circuit devices which, for a given effective channel length and dielectric composition, have substantially lower leakage current (and hence lower average power consumption) than will devices made by previously known methods.

In particular, the present invention provides CMOS silicon on insulator IGFET integrated circuit devices which, for a given effective channel length and dielectric composition, have substantially lower (leakage current (and hence lower average power consumption) than will devices made by previously known methods.

The present invention also provides silicon on insulator IGFET integrated circuit devices which have substantially lower leakage current (and hence lower average power consumption) than comparable prior art devices under conditions where the fixed charge density of the dielectric interface increases greatly from the as-manufactured level.

In particular, the present invention provides CMOS silicon on insulator integrated circuits which have substantially lower leakage current (and hence lower average power consumption) than comparable prior art devices under conditions where the fixed charge density of the dielectric interface increases greatly from the as-manufactured level.

The present invention also provides silicon on insulator IGFET integrated circuit devices which have substantially lower leakage current (and hence lower average power consumption) than comparable prior art devices after withstanding a substantially higher total dose of ionizing radiations.

In particular, the present invention provides CMOS silicon on insulator integrated circuits which have substantially lower leakage current (and hence lower average power consumption) than comparable prior art devices after withstanding a substantially higher total dose of ionizing radiations.

The present invention can also be adapted for use with semiconductor materials other than silicon. In particular, the present invention can also be applied to semiconductors closely related to silicon, such as $Si_x Ge_{(1-x)}$, or $Si/Si_x Ge_{(1-x)}$ graded-composition structures, or $Si/Si_x C_{(1-x)}$ graded-composition structures, or $Si/Si_x C_{(1-x)}/Si_x Ge_{(1-x)}$ graded-composition structures. The present invention can also be applied to self-aligned isolation implantation in III-V devices. Particularly in III-V semiconductors with relatively small bandgaps (e.g. 1.5 eV or less), implantation of dopants to avoid inversion at a dielectric interface (with consequent turn-on of a parasitic device) may be useful. Alternatively, in many III-V devices unannealed implantation damage is used for isolation (due to the effects of lattice damage), and the present invention may also be used to provide a narrow region of isolation of this type next to the edge of a mesa or trench.

The present invention can also (somewhat less preferably) be adapted to apply to improve isolation characteristics of trench-isolated bulk devices generally. That is, etching a trench and providing an insulating material to stop leakage current across the trench is not the end of isolation requirements: it is also necessary to control parasitic and leakage currents which might run laterally in the semiconductor material along the faces of the trench. By using a mask for an isolation implant which is differentiated from the trench etch mask by a self-aligned sidewall filament, the present invention provides a self-aligned isolation region at the faces of the isolation trench, down to a depth determined by the implant energy and diffusion length.

The present invention can also be adapted to avoid sidewall leakage and inversion problems in semiconductor or insulator integrated circuits using other types of active devices, such as bipolar or MESFET transistors, or others: the advantages of the present invention are generally applicable.

According to the present invention there is provided: A semiconductor-on-insulator device fabricated by the steps of: providing a substrate having at a surface thereof a layer of monocrystalline semiconductor material overlying a layer of an insulator; providing a patterned masking layer over said monocrystalline semiconductor layer, said masking layer being patterned to cover predetermined portions of said semiconductor layer where active devices are to be formed; implanting a channel stop dopant substantially into portions of said semiconductor material which are not covered by said masking layer; forming sidewall filaments on said patterned masking layer, so that said patterned masking layer with said filaments covers a larger fraction of said semiconductor layer than was covered by said masking layer alone, but does not cover all of said semiconductor layer; etching away said semiconductor material except where substantially covered by said masking layer and/or said sidewall filaments on said masking layer, said etching step leaving semiconductor mesas separated by areas of said insulators; providing a dielectric covering at least some portions of said semiconductor mesas; and forming a patterned thin film of conductive material, said patterned thin film of a conductive material providing gates of field effect transistors having channel regions in said mesa. Bipolar transistors may be fabricated in some of the semiconductor mesas.

According to the present invention there is also provided: A process for fabricating a semiconductor-on-insulator integrated circuit structure, comprising the steps of: providing a substrate having at a surface thereof a layer of monocrystalline semiconductor material overlying a layer of an insulator; providing a patterned masking layer over said monocrystalline semiconductor layer, said masking layer being patterned to cover predetermined portions of said semiconductor layer where active devices are to be formed; implanting a dopant substantially into at least some of the portions of said semiconductor material which are not covered by said masking layer; forming sidewall filaments on said patterned masking layer, so that said patterned masking layer with said filaments covers a larger fraction of said semiconductor layer than was covered by said masking layer alone, but does not cover all of said semiconductor layer; and fabricating active devices in said mesas.

According to the present invention there is also provided: A process for fabricating a semiconductor-on-insulator device, comprising the steps of: providing a substrate having at a surface thereof a layer of monocrystalline semiconductor material overlying a layer of an insulator; providing a patterned masking layer over said monocrystalline semiconductor layer, said masking layer being patterned to cover predetermined portions of said semiconductor layer where active devices are to be formed; implanting a p-type channel stop dopant into some portions of said semiconductor material which are not covered by said masking layer; forming sidewall filaments on said patterned masking layer, so that said patterned masking layer with said filaments covers a larger fraction of said semiconductor layer than was covered by said masking layer alone, but does not cover all of said semiconductor layer; etching away said semiconductor material except where substantially covered by said masking layer and/or said sidewall filaments on said masking layer, said etching step leaving semiconductor mesas separated by areas of said insulator; providing a dielectric covering at least some portions of said semiconductor mesas; and forming a patterned thin film of conductive material, said patterned thin film of a conductive material providing gates of n-channel field effect transistors having channel regions in ones of said mesas which include an admixture of dopant atoms introduced by said channel stop implanting step around the periphery thereof, and also of p-channel field effect transistors having channel regions in others of said mesas.

According to the present invention there is also provided: A process for fabricating a semiconductor-on-insulator device, comprising the steps of: providing a substrate having at a surface thereof a layer of monocrystalline semiconductor material overlying a layer of an insulator; providing a patterned masking layer over said monocrystalline semiconductor layer, said masking layer being patterned to cover predetermined portions of said semiconductor layer where active devices are to be formed; implanting a channel stop dopant substantially into portions of said semiconductor material which are not covered by said masking layer; forming sidewall filaments on said patterned masking layer, so that said patterned masking layer with said filaments covers a larger fraction of said semiconductor layer than was covered by said masking layer alone, but does not cover all of said semiconductor layer; etching away said semiconductor material except where substantially covered by said masking layer and/or sidewall filaments on said masking layer, said etching step leaving semiconductor mesas separated by areas of said insulator; providing a dielectric covering at least some portions of said semiconductor mesas; and forming a patterned a thin film of conductive material, said patterned thin film of a conductive material providing gates of field effect transistors having channel regions in said mesa.

BRIEF DESCRIPTION OF THE DRAWINGS

The present invention will be described with reference to the accompanying drawings, wherein:

FIG. 1L shows a sample device fabricated according to the present invention.

DESCRIPTION OF THE PREFERRED EMBODIMENTS

Figure 1A:
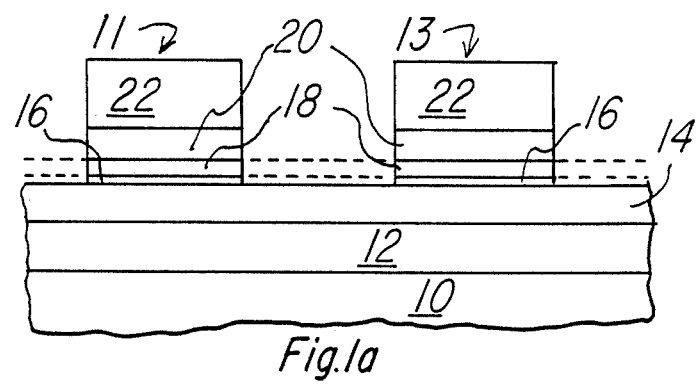
FIGS. 1A through 1L show a sample process flow according to the present invention.

The making and use of the presently preferred embodiments will now be discussed in great detail. However, it should be appreciated that the present invention provides widely applicable inventive concepts, which can be embodied in a tremendous variety of specific contexts; the specific embodiments discussed are merely illustrative of specific ways to make and use the invention, and do not delimit the scope of the invention.

The starting material is silicon-on-insulator material, having about 3400 Å of monocrystalline silicon 14 over a buried layer 12 consisting essentially of silicon dioxide (perhaps with minor excess of silicon or very minor silicon inclusions), which is supported by an underlying silicon substrate 10. The surface layer 14 can be, e.g., n-type $<100>$. 3-6 $\Omega$-cm (dopant concentration about 5E15 cm$^{-3}$). Alternatively, the substrate 10 and surface layer 14 can be p-type (e.g. 10-12 $\Omega$-cm), to take advantage of the depletion region created under buried layer 12 to reduce parasitic capacitance and lateral breakdown at the oxide interface.

An oxide/nitride/oxide hardmask will now be made into a patterned masking layer 24 which covers the active device areas.

In this example, 350 Å of oxide 16 is grown, 1400 Å of Si$_3$N$_4$ 18 is LPCVD deposited, and then 2500 Å of silicon dioxide 20 is LPCVD deposited.

Resist 22 is then patterned to cover the moats, i.e. the regions where active devices are to be formed. and a plasma etch is used to etch through the oxide/nitride/oxide stack 16, 18, 20 in accordance with the resist pattern. This produces the structure of FIG. 1A, in which the oxide/nitride/oxide layers 16, 18, 20 have been etched to form the patterned masking layer 24, which has nearly vertical sidewalls in the range of 87 to 90 inclusive. The resist 22 is then stripped.

Figure 1B:
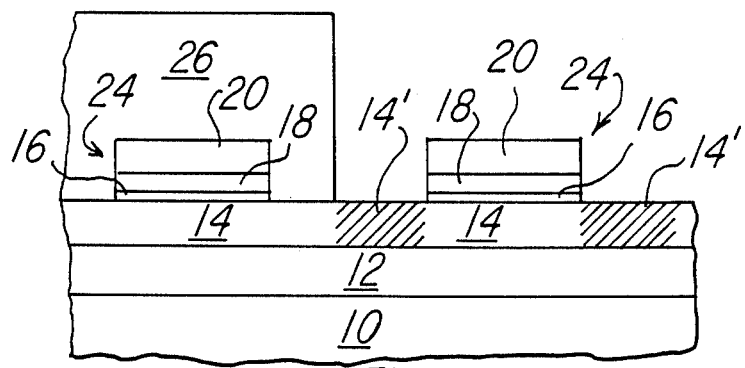

Photoresist 26 is now patterned to cover the PMOS device areas 11, so that only portions 14' of silicon layer 14 next to the NMOS device areas 13 receive the extra sidewall channel stop implant which is to follow. A p-type impurity is now implanted into regions 14' to form the sidewall channel stops (for the NMOS device areas), e.g. 3E12 cm$^{-2}$ of B at 30 keV plus 5E12 cm$^{-2}$ of B at 80 keV. This produces the structure of FIG. 1B. The resist 26 is stripped.

Figure 1C:
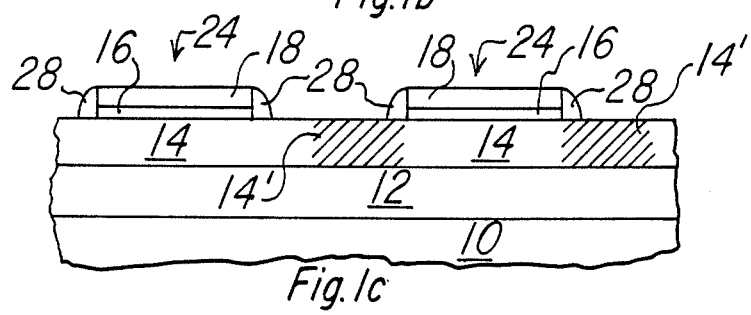

Silicon dioxide is now LPCVD deposited (e.g. to 1000 Å thickness) and densified. A drive step is preferably performed at this point too (e.g. 100 minutes in argon at 900° C.), to provide a vertically uniform distribution for the sidewall channel stop dopants and give them some lateral diffusion (in this example, around 0.05 micron) from the silicon 14' into the portions of silicon regions 14 which lie under mask regions 24. The silicon dioxide layer is then anisotropically etched back (e.g. plasma etched using a fluorine chemistry) to leave filaments 28 on the sidewalls of the patterned masking layer 24 over the moat regions. (Note that, in this sample embodiment, the top oxide layer 20 of the patterned masking layer 24 is removed by the overetch portion of this oxide etch.) This results in the structure shown in FIG. 1C. It should be noted that the patterned masking layer 24 does not have to be an oxide/nitride/oxide stack, and (in less preferred embodiments) does not even have to be a hardmask: photoresist could be used to form the layer 24, particularly if a photoresist having a relatively high reflow temperature (preferably 150° C. or more) is used. An example of such a high-temperature photoresist is Kodak 820, which has a glass reflow temperature in the neighborhood of 170° C. (as compared to glass reflow temperatures in the neighborhood of 130° C. for more commonly used photoresists).

A silicon etch which is selective to silicon dioxide (e.g. a plasma etch using a chlorine chemistry) is then applied, so that all portions of the silicon layer 14 and 14' except those covered by the patterned masking layer 24 and the sidewall filaments 28 are etched down to the buried oxide layer. The silicon layer 14 has now been reduced to a set of islands (mesas) 32 on the oxide layer 12, where the islands 32 in NMOS device locations have a narrow strip of boron-doped silicon 14' all around their edges. The semiconductor material of the mesas may comprises more than 50% atomic of silicon and have a vertically varying bandgap.

Figure 1D:
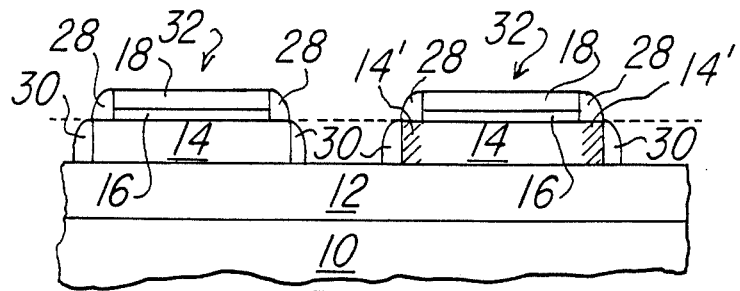

Oxide filaments 30 are now formed to passivate the sidewalls of the islands. For example, 250 Å of oxide is grown on the sidewall (for better interface characteristics). 2500 Å more of oxide is LPCVD deposited, and a plasma oxide etch is then performed to leave filaments 30. This results in the structure of FIG. 1D. The remaining portions of the hardmask layers 16, 18, 20 are now stripped, and a dummy gate oxide 34 is grown (e.g. to 250 Å).

Figure 1E:
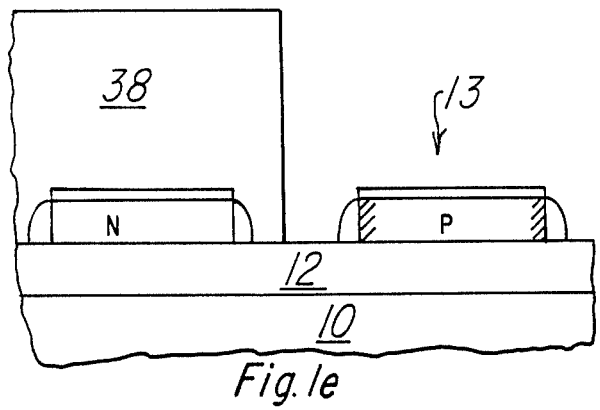
Figure 1F:
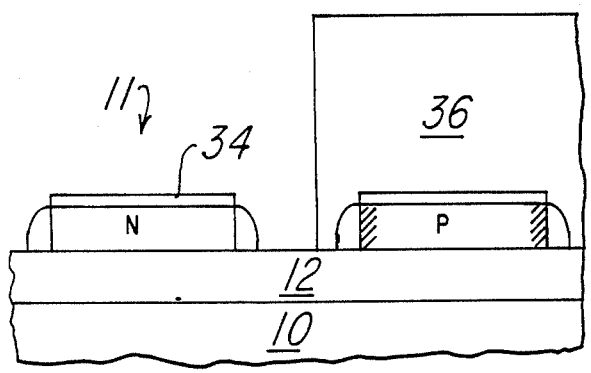

Photoresist 38 is now patterned (as shown in FIG. 1E) to expose only the NMOS device areas 13, and threshold-adjusting implants are performed to set the n-channel back threshold voltage V$_{TNB}$, e.g. 2.5 E12 cm$^{-2}$ of boron at 85 keV. (If it is desired to increase the front threshold voltage V$_{TNF}$, a 25 keV B implant may also be used at this point.) Photoresist 36 is now patterned (as shown in FIG. 1F) to expose only the PMOS device areas 11, and threshold-adjusting implants are performed to set the p-channel front threshold voltage V$_{TPF}$, e.g. 1.45E12 cm$^{-2}$ of boron at 25 keV, and to set the p-channel back threshold voltage V$_{TPB}$, e.g. 1.2E12 cm$^{-2}$ of phosphorus at 180 keV. The dosages given are designed to produce V$_{TNF}$=0.8 V, V$_{TNB}$>25 V, V$_{TPF}$= $-0.75$ V, and V$_{TPB}$< $-13$ V; as is well known by those skilled in the art, it is quite straightforward to adjust these dosages if different threshold voltage values are needed.)

Figure 1G:
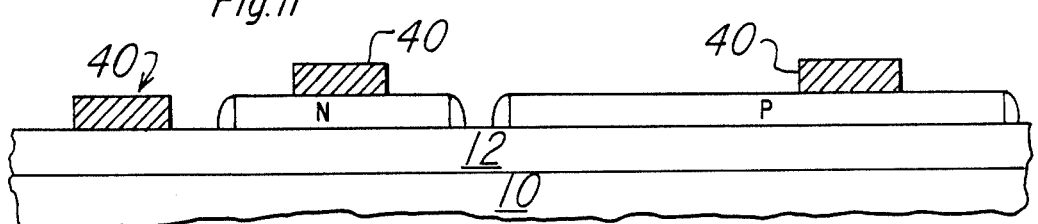

The dummy gate oxide 34 is now stripped, gate oxide is grown (e.g. to 250 Å), and polysilicon is deposited (e.g. to 4500 Å thick), doped, patterned, and etched to provide a pattern of lines 40. These lines provide the gates of the NMOS and PMOS transistors, and also provide a level of interconnect, as shown in FIG. 1G.

The n+ and p+ source/drain regions will now be formed.

First, in this embodiment, 2000 Å of CVD oxide is deposited to provide a hardmask layer 42. (This layer 42 enables formation of an ESD protection diode structure 102, as will be described below, and also provides gate sidewall filaments 52.)

Figure 1H:
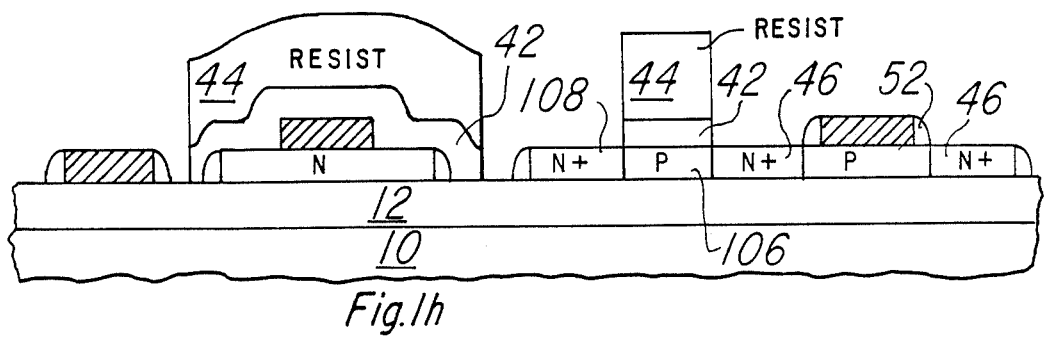

Photoresist 44 is now patterned, the oxide 42 is etched away where exposed, and the NMOS source/drain regions 46 are formed by an implant of, e.g., $2.5E15$ cm$^{-2}$ of phosphorus at 75 keV, as shown in FIG. 1H.

Figure 1I:
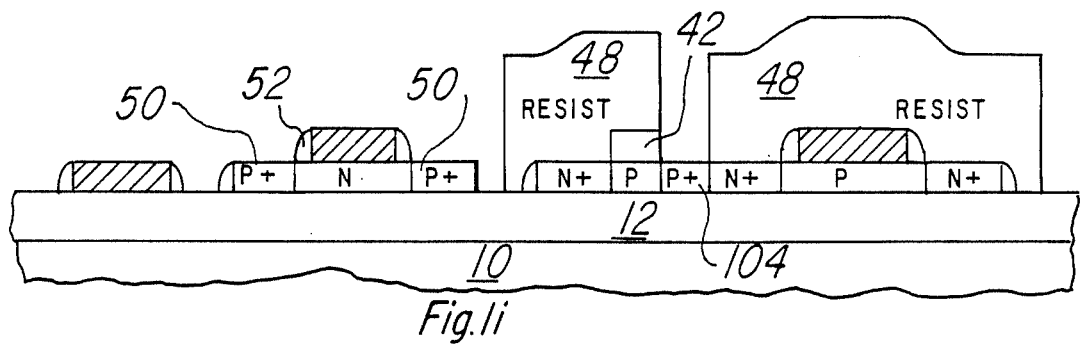

Photoresist 44 is now stripped, Photoresist 48 is patterned to expose the PMOS device areas (and also any portions within the NMOS device areas where a p+ region is desired as part of the diode structure 102), the oxide 42 is etched away where exposed, and the PMOS source/drain regions 46 are formed by an implant of, e.g., $2E15$ cm$^{-2}$ of boron at 45 keV, as shown in FIG. 1I.

The source/drain implants are now annealed, e.g. for 60 minutes at 900 °C.

As another optional feature, titanium silicide regions 54 are formed on polysilicon areas 40 and on moat areas (i.e. exposed monocrystalline silicon regions) 104, 108, 46, and 50, and TiN local interconnects 56 are formed to provide another partially independent interconnect level.

A titanium layer is deposited, e.g. to 1000 Å thick, by sputtering, and heated to (e.g.) 675° C. for 30 minutes in an atmosphere of Ar plus $N_2$, to produce titanium silicide compounds 54' at all places where silicon (monocrystalline or polycrystalline) is exposed, and titanium nitride compounds everywhere the titanium is exposed to the nitrogen atmosphere, including (in a lesser thickness) overlying the titanium silicide regions.

Figure 1J:
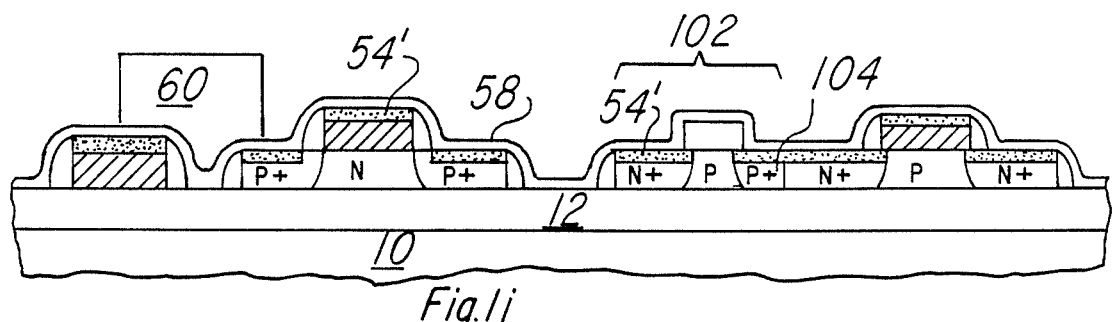

The titanium nitride material can now be stripped. However, as an optional modification, a photoresist or hardmask layer 60 can now be patterned (as shown in FIG. 1J) to protect a selected portion of the conductive titanium nitride compounds from stripping and form local interconnects 56.

Figure 1K:
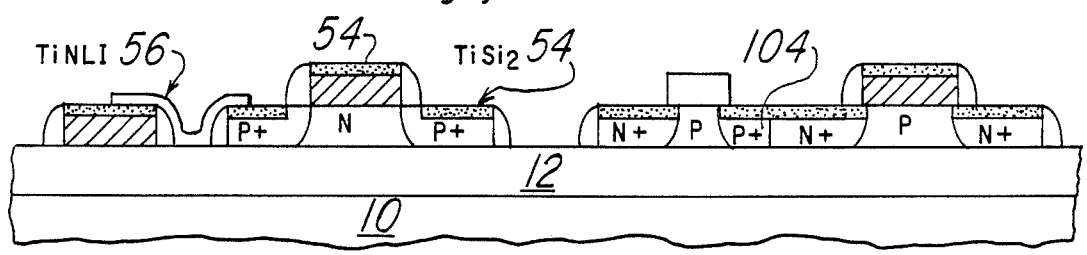

An anneal is now performed to convert the titanium silicide compounds 54' into titanium silicide compounds 54 which have lower sheet resistance (and are probably more nearly stoichiometric $TiSi_2$), as shown in FIG. 1K. For example, 30 minutes at 800° C. in an argon or nitrogen atmosphere will accomplish this.

Figure 1L:
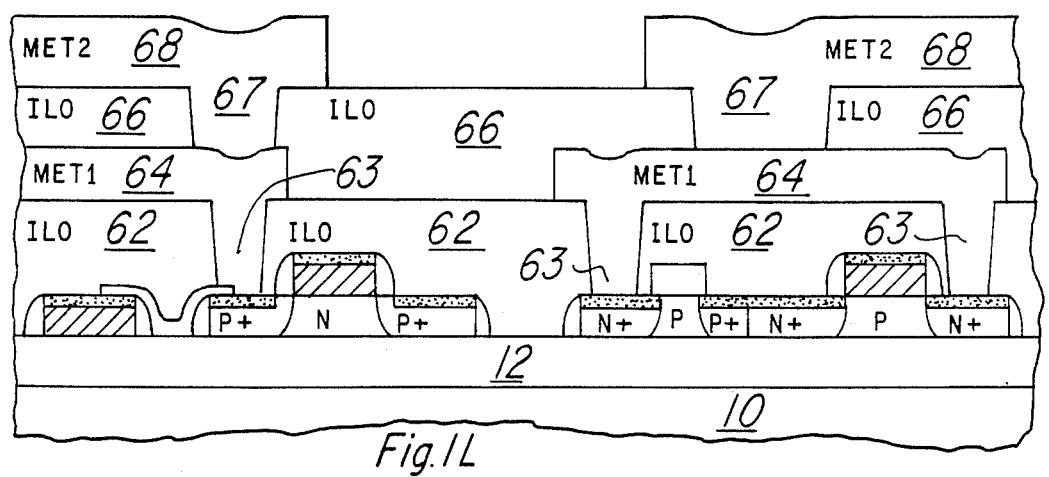

The metal layers 64 and 68 will now be formed, using conventional methods, to interconnect the devices in predetermined circuit configuration. For example, 1.2 microns of oxide is CVD deposited and planarized (e.g. by a resist etchback which removes 7000 Å of oxide from the lowest regions, and less from the higher regions). Five hundred Å more of oxide is then deposited, after which 3500 Å of phosphosilicate glass (PSG) (containing, in this example, 5% P) is deposited and densified. This forms the first interlevel dielectric 62, which is now patterned and etched away at locations 63, and first metal 64 is now deposited and etched to make contact to silicon in desired locations. Similarly, second interlevel dielectric is now deposited, planarized, and etched away at via locations 67, and second metal layer 68 is deposited and etched in a predetermined pattern. This produces the structure of FIG. 1L.

Processing concludes with conventional steps such as protective overcoat deposition, and removal in selected bond pad locations.

It should be noted that the present invention is not only applicable to semiconductor on insulator devices; it can also (somewhat less preferably) be adapted to apply to trench-isolated bulk devices too (i.e. to devices wherein the active device regions are continuous with a monocrystalline semiconductor substrate), particularly where the trench is relatively shallow. That is, trench isolated bulk devices also have problems with leakage along the sidewalls of the trenches, and the present invention can be applied to prevent this leakage to the depth the ion implantation can reach. In such applications, a patterned masking layer would be used to define the areas which are exposed to implant, and the same patterned masking layer, modified with a sidewall filament, would be used to mask the trench etch. However, the useful depth is limited in such applications by two factors: the available implant energies, and the stopping power of the mask against a high-energy implant. Thus, the applications of the present invention to trench isolation preferably provide greatly enhanced isolation along the trench sidewall only to a depth of one half micron, or less preferably to a greater depth (which still is more preferably less than a micron), even if the physical depth of the etched trench is greater than the depth of greatly enhanced isolation.

The SOI case uses a thin silicon layer (e.g. 3500 Å and preferably in the range of 2000–5000 Å) in which the overlapping channel stop implants must give rise to a reasonably uniform sidewall doping concentration. Since the active silicon layer is thin, the boron energies needed are practical energies for typical implanters; since the boron energies needed are reasonably low, the masking needed to screen the implant does not have to have an impracticably large thickness (whether resist or hard masking is used).

Of course, where the trench walls are not quite vertical (for example, sidewall angles of 87 or 88 degrees are common at present), and particularly where the implant beam is also not quite vertical (for example, ion beam angles in the neighborhood of seven degrees off normal to the face of the wafer being processed are currently common), a significant fraction of the implant dose will accordingly reach into an exposed trench sidewall regardless of distance from the surface. However, application of the present invention to trench isolation has substantial advantages of such methods of trench sidewall passivation. The use of sidewall filaments means that the process parameters which control the depth of sidewall penetration are quite controllable; and the dose efficiency of a direct implant is substantially higher than that of the glancing incidence which results in the sample just described.

Of course the polysilicon gate layer so frequently referred to in the present application does not have to be strictly polysilicon, but can be other materials which are substantially polycrystalline or amorphous and contain a large fraction of silicon; in this usage silicides and polysilicon/silicide sandwich structures are certainly comprehended, and future sandwich structures which have analogous deposition and electrical properties in future processes to the place of polysilicon in present processes are intended to be comprehended also. Similarly, the metal interconnect lines referred to can comprise Al, Al:1% Si. Al:Ti, TiW, layered combinations thereof, or others of the many thin-film metallization structures well known to those skilled in the art of integrated circuit fabrication.

As will be appreciated by those skilled in the art, the present invention can be widely modified and varied, and its scope is not limited except as specified in the allowed claims.

What is claimed is:

1. A process for fabricating a semiconductor-on-insulator integrated circuit structure, comprising the steps of:
  (a) providing a substrate having at a surface thereof a layer of monocrystalline semiconductor material overlying a layer of an insulator;
  (b) providing a patterned masking layer over said monocrystalline semiconductor layer, said masking layer being patterned to cover predetermined portions of said semiconductor layer where active devices are to be formed;
  (c) implanting a dopant substantially into at least some of the portions of said semiconductor material which are not covered by said masking layer;
  (d) forming sidewall insulation filaments on said patterned masking layer, so that said patterned masking layer with said filaments covers a larger fraction of said semiconductor layer than was covered by said masking layer alone, but does not cover all of said semiconductor layer;
  (e) etching away at least some portions of said monocrystalline semiconductor material to form separated mesas of said monocrystalline semiconductor material on said insulator; and
  (f) fabricating active devices in said mesas.

2. The process of claim 1, further comprising the substep of masking predetermined portions of said semiconductor material, prior to said implanting step (c), with an additional masking layer such that not all portions of said semiconductor material which are not covered by said masking layer are exposed to said step of dopant implanting.

3. The process of claim 1, further comprising the subsequent step of forming an encapsulating dielectric on substantially all of said sidewalls of substantially all of said mesas.

4. The process of claim 1, wherein the thickness of said mesas is between 0.1 and 1 micron inclusive.

5. The process of claim 1, wherein the minimum width of said mesas is between 0.5 and 10 microns inclusive.

6. The process of claim 1, wherein said semiconductor material of said mesas comprises more than 50% atmomic of silicon and has a vertically varying bandgap.

7. The process of claim 1, wherein said patterned masking material consists essentially of exposed photoresist.

8. The process of claim 1, wherein said step of etching away said semiconductor material except where substantially covered by said masking layer and/or said sidewall filaments on said masking layer leaves semiconductor mesas having a substantially vertical sidewall angle.

9. The process of claim 1, further comprising the subsequent step of fabricating bipolar transistors in predetermined ones of said semiconductor mesas.

10. The process of claim 1, further comprising the subsequent step of fabricating field-effect transistors in predetermined ones of said semiconductor mesas.

11. The process of claim 3, wherein said sidewall encapsulating dielectric is more than 500 Angstroms thick.

12. The process of claim 7, wherein said sidewall filaments on said patterned masking layer consist essentially of silicon dioxide.

13. The process of claim 7, wherein said patterned masking material consists essentially of a photoresist material which has a reflow temperature greater than 150° C.

14. The process of claim 8, wherein said sidewall angle of said mesas is in the range of 87–90 degrees inclusive.

15. The process of claim 10, wherein said field-effect transistors comprise MESFET transistors.

16. A process for fabricating a semiconductor-on-insulator device, comprising the steps of:
  (a) providing a substrate having at a surface thereof a layer of monocrystalline semiconductor material overlying a layer of an insulator;
  (b) providing a patterned masking layer over said monocrystalline semiconductor layer, said masking layer being patterned to cover predetermined portions of said semiconductor layer where active devices are to be formed;
  (c) implanting a channel stop dopant substantially into portions of said semiconductor material which are not covered by said masking layer;
  (d) forming sidewall insulation filaments on said patterned masking layer, so that said patterned masking layer with said filaments covers a larger fraction of said semiconductor layer than was covered by said masking layer alone, but does not cover all of said semiconductor layer;
  (e) etching away said semiconductor material except where substantially covered by said masking layer and/or said sidewall filaments on said masking layer, said etching step leaving semiconductor mesas separated by areas of said insulator;
  (f) providing a dielectric covering at least some portions of said semiconductor mesas; and
  (g) forming a patterned thin film of conductive material, said patterned thin film of a conductive material providing gates of field effect transistors having channel regions in said mesa.

17. The process of claim 16, wherein said implanting step (c) introduces dopants only into some predetermined portions of said semiconductor material which are not covered by said masking layer, and not into other portions of said semiconductor material which are not covered by said masking layer.

18. The process of claim 16, wherein said step of forming a dielectric comprises the substeps of:
  (f)
    i. forming a gate insulator over predetermined active device regions of said mesa; and
    ii. forming an encapsulating dielectric on sidewalls of said respective mesas.

19. The process of claim 16, wherein the thickness of said mesas is between 0.1 and 1 micron inclusive.

20. The process of claim 16, wherein the minimum width of said mesas is between 0.5 and 10 microns inclusive.

21. The process of claim 16, wherein said mesa comprises a III-V semiconductor material.

22. The process of claim 16, wherein said patterned thin film of conductive material is polycrystalline and comprises more than 30% atomic of silicon.

23. The process of claim 16, wherein said patterned masking material consists essentially of exposed photoresist.

24. The process of claim 16, wherein said step of etching away said semiconductor material except where substantially covered by said masking layer and/or said sidewall filaments on said masking layer leaves semiconductor mesas having a substantially vertical sidewall angle.

25. The process of claim 17, further comprising the substep of masking predetermined portions of said semiconductor material, prior to said implanting step (c), with an additional masking layer.

26. The process of claim 18, wherein said encapsulating dielectric is formed on substantially all of said sidewalls of substantially all of said mesas.

27. The process of claim 23, wherein said sidewall filaments on said patterned masking layer consist essentially of silicon dioxide.

28. The process of claim 23, wherein said patterned masking material consists essentially of a photoresist material which has a reflow temperature greater than 150° C.

29. The process of claim 24, wherein said sidewall angle of said mesas is in the range of 87-90 degrees inclusive.

30. The process of claim 25, wherein said an additional masking layer overlies said patterned masking layer provided in step (b).

31. The process of claim 25,
wherein said field effect transistors comprise both p-channel transistors and n-channel transistors,
and wherein said additional masking layer protects predetermined locations of said p-channel transistors and not of said n-channel transistors from said implanted channel stop dopant.

32. A process for fabricating a semiconductor-on-insulator device, comprising the steps of:
(a) providing a substrate having at a surface thereof a layer of substantially monocrystalline semiconductor material comprising silicon overlying a layer of an insulator;
(b) providing a patterned masking layer over said monocrystalline semiconductor layer, said masking layer being patterned to cover predetermined portions of said semiconductor layer where active devices are to be formed;
(c) implanting a p-type channel stop dopant into some portions of said semiconductor material which are not covered by said masking layer;
(d) forming sidewall insulation filaments on said patterned masking layer, so that said patterned masking layer with said filaments covers a larger fraction of said semiconductor layer than was covered by said masking layer alone, but does not cover all of said semiconductor layer;
(e) etching away said semiconductor material except where substantially covered by said masking layer and/or said sidewall filaments on said masking layer, said etching step leaving semiconductor mesas separated by areas of said insulator;
(f) providing a dielectric covering at least some portions of said semiconductor mesas; and
(g) forming a patterned thin film of conductive material, said patterned thin film of a conductive material providing gates of n-channel field effect transistors having channel regions in ones of said mesas which include an admixture of dopant atoms introduced by said channel stop implanting step around the periphery thereof, and also of p-channel field effect transistors having channel regions in others of said mesas.

33. The process of claim 32, further comprising the substep of masking predetermined portions of said semiconductor material, prior to said implanting step (c), with an additional masking layer.

34. The process of claim 32, wherein said step of forming a dielectric comprises the substeps of:
(f)
i. forming a gate insulator over predetermined active device regions of said mesa; and
ii. forming an encapsulating dielectric on sidewalls of said respective mesas.

35. The process of claim 32, wherein said insulator region under said mesas consists essentially of silicon dioxide.

36. The process of claim 32, wherein the thickness of said mesas is between 0.1 and 1 micron inclusive.

37. The process of claim 32, wherein the minimum width of said mesas is between 0.5 and 10 microns inclusive.

38. The process of claim 32, wherein said step of forming a dielectric forms a passivating dielectric layer on said sidewalls of said mesa and also forms a gate dielectric which is thinner than said passivating dielectric on predetermined active device regions of said respective mesas.

39. The process of claim 32, wherein said patterned thin film of conductive material is polycrystalline and comprises more than 30% atomic of silicon.

40. The process of claim 32, wherein said semiconductor material of said mesas comprises more than 50% atomic of silicon and has a vertically varying bandgap.

41. The process of claim 32, wherein said patterned masking material consists essentially of exposed photoresist.

42. The process of claim 32, wherein said step of etching away said semiconductor material except where substantially covered by said masking layer and/or said sidewall filaments on said masking layer leaves semiconductor mesas having a substantially vertical sidewall angle.

43. The process of claim 34, wherein said encapsulating dielectric is formed on substantially all of said sidewalls of substantially all of said mesas.

44. The process of claim 38, wherein said gate dielectric has an equivalent dielectric thickness less than that of 500 Angstroms of silicon dioxide.

45. The process of claim 38, wherein said sidewall passivating dielectric has an equivalent thickness greater than that of 500 Angstroms of silicon dioxide.

46. The process of claim 38, wherein said gate dielectric is grown.

47. The process of claim 41, wherein said sidewall filaments on said patterned masking layer consist essentially of silicon dioxide.

48. The process of claim 41, wherein said patterned masking material consists essentially of a photoresist material which has a reflow temperature greater than 150° C.

49. The process of claim 42, wherein said sidewall angle of said mesas is in the range of 87-90 degrees inclusive.

* * * * *